United States Patent
Park et al.

(10) Patent No.: US 7,254,078 B1
(45) Date of Patent: Aug. 7, 2007

(54) SYSTEM AND METHOD FOR INCREASING RELIABILITY OF ELECTRICAL FUSE PROGRAMMING

(75) Inventors: Byeongju Park, Poughkeepsie, NY (US); John M. Safran, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/307,785

(22) Filed: Feb. 22, 2006

(51) Int. Cl.
*G11C 7/00* (2006.01)

(52) U.S. Cl. .................................. 365/225.7; 365/200

(58) Field of Classification Search ............ 365/225.7, 365/200, 230.06
See application file for complete search history.

(56) References Cited

U.S. PATENT DOCUMENTS

| | | | |
|---|---|---|---|
| 4,914,055 A | 4/1990 | Gordon et al. | |
| 5,272,666 A | 12/1993 | Tsang et al. | |
| 5,412,593 A | 5/1995 | Magel et al. | |
| 5,621,691 A * | 4/1997 | Park ........................... | 365/200 |
| 5,903,041 A | 5/1999 | La Fleur et al. | |
| 6,096,580 A | 8/2000 | Iyer et al. | |
| 6,323,534 B1 * | 11/2001 | Marr et al. .................. | 257/529 |
| 6,346,846 B1 | 2/2002 | Bertin et al. | |
| 6,388,305 B1 | 5/2002 | Bertin et al. | |
| 6,396,120 B1 | 5/2002 | Bertin et al. | |
| 6,396,121 B1 | 5/2002 | Bertin et al. | |
| 6,433,404 B1 | 8/2002 | Iyer et al. | |
| 6,498,056 B1 | 12/2002 | Motsiff et al. | |
| 6,512,284 B2 | 1/2003 | Schulte et al. | |
| 6,570,207 B2 | 5/2003 | Hsu et al. | |
| 6,577,156 B2 | 6/2003 | Anand et al. | |

(Continued)

FOREIGN PATENT DOCUMENTS

| WO | WO 2004/100271 A1 | 11/2004 |
|---|---|---|
| WO | WO 2006/028946 A2 | 3/2006 |

OTHER PUBLICATIONS

C. Kothandaraman et al., "Electrically Programmable Fuse (eFUSE) Using Electromigration in Silicides", IEEE Electron Device Letters, vol. 23, No. 9, Sep. 2002, pp. 523-525.
U.S. Appl. No. 11/307,785, entitled, "System and Method for Increasing Reliability of Electrical Fuse Programming", filed Feb. 22, 2006, to Byeongju Park et al.

(Continued)

*Primary Examiner*—Vu A. Le
(74) *Attorney, Agent, or Firm*—Scully, Scott, Murphy & Presser, P.C.; Joseph P. Abate, Esq.

(57) ABSTRACT

A system and method for achieving enhanced e-fuse programming reliability. By providing an e-fuse device with redundantly coded fuse structures each with a differing fuse size dimension, reliable encoding of a fuse with a programmed bit is enhanced. That is, for each e-fuse device, each of the multiple fuse structures and a corresponding programming devices associated with each fuse structure is dimensioned to achieve the coding redundancy such that one fuse structure of the multiple fuse structures provides for a current flow of sufficient current density to ensure programming reliability of the e-fuse device. In one embodiment, each the corresponding programming transistor device is of substantially identical size and, each fuse structure of the multiple fuse structures is of a different size. Alternately, each fuse structure is of substantially identical size and each programming transistor device is of a different size, thereby ensuring reliable coding over a programmed current range.

21 Claims, 4 Drawing Sheets

U.S. PATENT DOCUMENTS

| | | |
|---|---|---|
| 6,617,914 B1 | 9/2003 | Kothandaraman |
| 6,621,324 B2 | 9/2003 | Fifield et al. |
| 6,624,031 B2 | 9/2003 | Abadeer et al. |
| 6,624,499 B2 | 9/2003 | Kothandaraman et al. |
| 6,661,330 B1 | 12/2003 | Young |
| 6,750,530 B1 | 6/2004 | Klaasen et al. |
| 6,751,137 B2 * | 6/2004 | Park et al. .................. 365/200 |
| 6,753,590 B2 | 6/2004 | Fifield et al. |
| 6,794,726 B2 | 9/2004 | Radens et al. |
| 6,853,049 B2 | 2/2005 | Herner |
| 6,879,021 B1 | 4/2005 | Fitfield et al. |
| 6,882,027 B2 | 4/2005 | Brintzinger et al. |
| 6,927,997 B2 | 8/2005 | Lee et al. |
| 6,944,054 B2 | 9/2005 | Rueckes et al. |
| 6,972,614 B2 | 12/2005 | Anderson, II et al. |
| 7,087,499 B2 | 8/2006 | Rankin et al. |
| 2004/0004268 A1 | 1/2004 | Brown et al. |
| 2005/0247997 A1 * | 11/2005 | Chung et al. ................ 257/530 |
| 2006/0102982 A1 | 5/2006 | Park et al. |
| 2006/0278932 A1 | 12/2006 | Kothandaraman et al. |

OTHER PUBLICATIONS

U.S. Appl. No. 11/462,070, entitled, "Anti-Fuse Structure Optionally Integrated With Guard Ring Structure", filed Aug. 3, 2006, to James W. Adkisson et al.

U.S. Appl. No. 11/366,879, entitled, "Programmable Anti-Fuse Structures, Methods for Fabricating Programmable Anti-Fuse Structures, and Methods of Programming Anti-Fuse Structures", filed Mar. 2, 2006, to Louis C. Hsu.

U.S. Appl. No. 11/161,320, entitled, "Doped Single Crystal Silicon Silicided Efuse", filed Jul. 29, 2005, to William R. Tonti et al.

U.S. Appl. No. 11/266,740, entitled, "Efuse and Methods of Manufacturing the Same", filed Nov. 3, 2005, to William R. Tonti et al.

* cited by examiner

SYSTEM AND METHOD FOR INCREASING RELIABILITY OF ELECTRICAL FUSE PROGRAMMING

BACKGROUND OF THE INVENTION

1. Field of the Invention

The present invention relates to semiconductor electrical fuse (e-fuse) technology, in general, and particularly to a novel method for programming e-fuses and enhancing their reliability in electronic circuits.

2. Description of the Prior Art

Properly programming (commonly called "blowing") e-fuses require a carefully controlled level of programming current. Deviation of programming current from the optimal level results in "underblow" conditions where the fuse resistance is not as high as it should be or in "rupture" conditions where higher current physically disrupts the fuse structure leading to potential reliability problems during usage through the lifetime of the semiconductor chips.

Figure 1A:
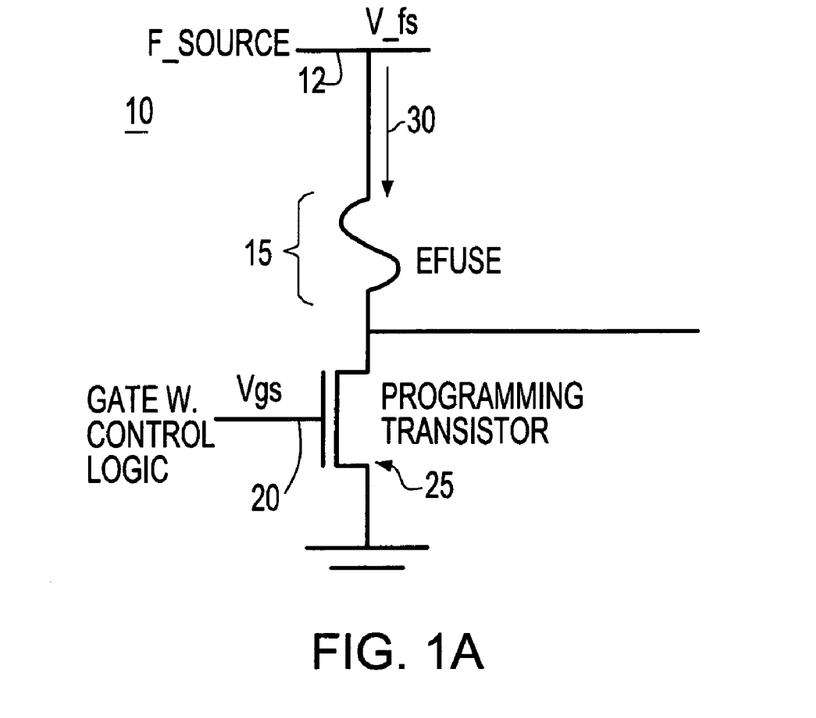
FIG. 1(a) illustrates a circuit 10 for programming an e-fuse device 15 according to the prior art.

FIG. 1(a) illustrates a circuit 10 including an e-fuse device 15 formed by conventional CMOS processing techniques for implementation in semiconductor integrated circuits, e.g., a data memory. As known in the e-fuse art, this circuit 10 includes a power source 12 (e.g., $V_{FS}$) connected to programmable transistor device 25 (e.g., a FET) that is responsive to a control signal 20, e.g., $V_{GS}$, to regulate the level of $I_{DS}$ current 30 flowing through the e-fuse 15 and the transistor 25 required to program (e.g., blow) the e-fuse thereby changing or customizing any connecting circuitry to meet the requirements of a specific application. For example, after the e-fuse has been blown, the circuit path of which it was a part no longer exists, and current is then directed along different pathways in the device.

Figure 1B:
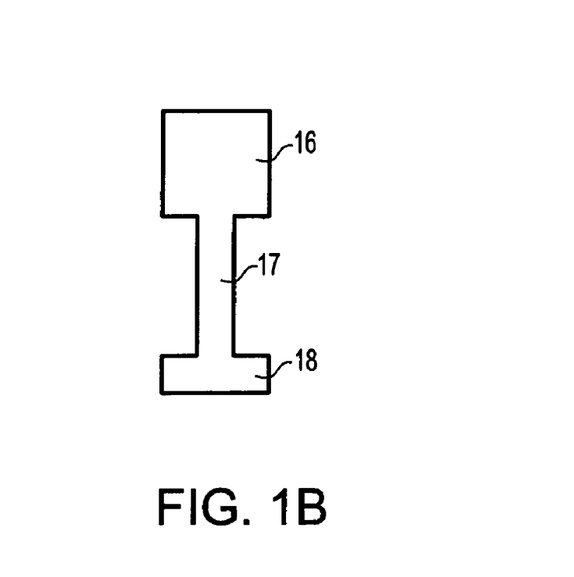
FIG. 1(b) illustrates an e-fuse structure formed by conventional CMOS processing techniques for implementation in a semiconductor integrated circuit.

As shown in FIG. 1(b), the e-fuse device 15 is a silicon based semiconductor structure having a cathode portion 18, a fuselink portion 17, and an anode portion 16. Typically, the fuselink is a narrow silicide structure, having dimension on the order of about 93 nm in width and a length of about 1.2 μm in length. The anode is silicided polysilicon having a width on the order of about 0.8 μm and a length on the order of about 2.0 μm, while the cathode is on the order of about 1.5 um wide and length is on the order of about 1.5 μm with the cathode connected to the programming transistor and the anode is connected to a high voltage power supply. At time of electrical fuse programming, i.e., applying a voltage to the anode and turning on the programming transistor to pass current through the fuselink, the silicide electromigrates from cathode to anode side and a structural change results (that is, the fuse is programmed). Suitable fuselink materials include, but are not limited to, cobalt silicide, titanium silicide, nickel silicide, palladium silicide, or other metal silicide material that displays electromigration characteristics. Other materials, with or without a silicide component, may also be suitable. A nitride or silicon dioxide material may form a top layer of the fuse structure shown in FIG. 1(b). The e-fuse structure may be formed in a variety of ways, for example, via a conventional semiconductor manufacturing processes which is compatible with advanced CMOS technology or other innovative methods that involve additional processing. The e-fuse circuitry may be designed in a variety of ways to improve the sensing of the status of the e-fuses.

Figure 2:
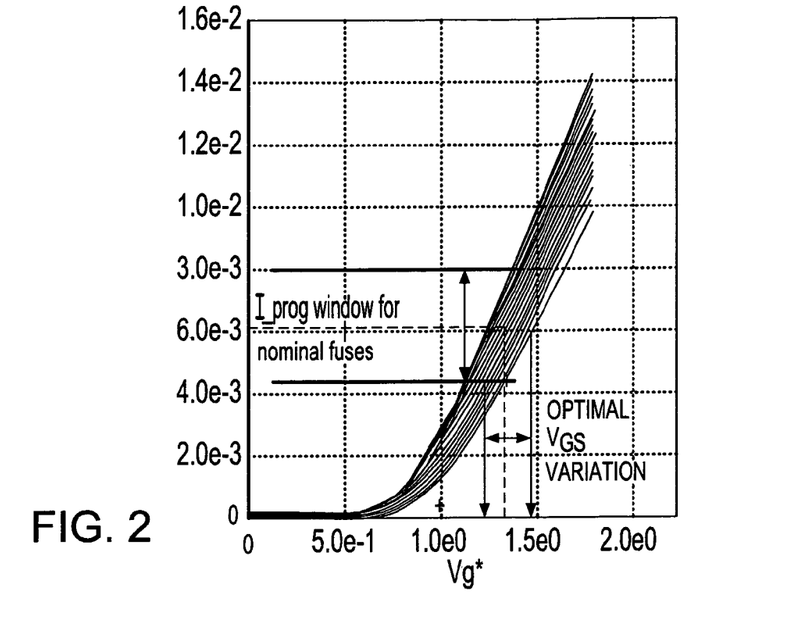
FIG. 2 is a graph 50 depicting the variation in $I_{DS}$–$V_{GS}$ characteristics of an example programming transistor device.

For like circuits including e-fuses, deviation from the ideal programming current level of $I_{DS}$ is caused in two ways: 1) first by the process variations during the manufacture of the hardware; and 2) second, from the ambient conditions of the chip during the programming, notably temperature. An example of process variation induced distribution of programming current is shown in FIG. 2. FIG. 2 particularly is a graph 50 depicting the variation in $I_{DS}$–$V_{GS}$ characteristics of an example semiconductor transistor device and particularly illustrates how the Ids current and Vgs voltage curve 75 varies at different chip operating temperatures, and particularly depicts the chip-by-chip variation of programming transistor I_on within one wafer.

As shown in FIG. 2, the operating temperature of the chip during programming could be affected by the ambient temperature and how much heat is being generated by the chip at the time of the programming, i.e., whether the chip is otherwise running at full speed inside a machine dissipating substantial heat or whether the chip is in a state close to standby. Given such a chip by chip response due to variations of the programmed transistor, FIG. 2 illustrates an I_prog range for the nominal e-fuse and an optimal Vgs variation.

In semiconductor chips where deviations from the ideal current range is sufficient, the e-fuses program in the underblow mode or rupture mode as described above. Since most or all fuses in such chips program outside the optimal programming window, typical circuit level redundancy solutions provide only a limited solution to the overall accuracy in the encoded data.

For example, if all fuses program in the rupture mode, all fuses are subject to the same reliability issue during the lifetime of the chips. Since the variation of the programming current affects all fuses in the same chip the same way, conventional redundancy solution of building a multiple number of fuses, each of which are identical among themselves, for the same bit still cannot avoid the inherent e-fuse programming reliability problem.

Similarly, if all fuses program in the underblow mode, improving the accuracy of the coded information will take building substantial number of redundancy e-fuses, each of which are identical among themselves, because each of the individual fuses have a fairly substantial chance of programming with low resistance. For this approach to be reliable, it would require a very large number of e-fuses and consequently, would require a large area of the chip for just one bit.

The problem of programming bits reliably becomes more acute when the information to be coded is critical to the chip's performance or to the performance of the equipment that the chip is controlling. Examples of such information are the information that is required to enable the rest of the chip or some features thereof; and the information that would determine the course of future actions and operations while a piece of equipment is in operation in the field.

Therefore, it would be highly desirable to provide such a method for programming an e-fuse device with an accuracy and reliability that are independent of the operating state of the chip.

It would also be highly desirable to provide such a method for programming an e-fuse device with an accuracy and reliability that are independent of inherent process variations caused during the manufacture of the chip.

It would be highly desirable to provide such a method for programming an e-fuse device with an accuracy and reliability while minimizing the area that the circuit uses by reducing the number of fuses and devices to a minimum number allowable.

SUMMARY OF THE INVENTION

The present invention is directed to an e-fuse circuit structure and programming method that enables the programming an e-fuse device with accuracy independent of the operating state of the chip.

The present invention is also directed to an e-fuse circuit structure and programming method that enables the programming an e-fuse device with accuracy independent of inherent process variations caused during the manufacture of the chip.

With the recognition that proper current density is critical for successful e-fuse programming, the system and method of the invention achieves enhanced e-fuse programming reliability by providing an e-fuse device having multiple redundantly coded fuse structures. Each of the multiple redundantly coded fuse structures is of differing fuse dimensions and/or of differing programming transistor size to ensure reliable encoding of the e-fuse device with a programmed bit. That is, for an e-fuse device, each of the multiple fuse structures and a corresponding programming devices associated with each fuse structure is dimensioned to achieve the coding redundancy such that at least one fuse structure of the multiple fuse structures provides for a current flow within optimal current density range to ensure programming reliability of the e-fuse device. In one embodiment, each the corresponding programming transistor device is of substantially identical size and, each fuse structure of the multiple fuse structures is of a different size. Alternately, each fuse structure is of substantially identical size and each programming transistor device is of a different size, thereby ensuring reliable coding over a programmed current range and accounting for any programming current variability.

Thus, according to one aspect of the invention, there is provided a programmable e-fuse device for a semiconductor chip and a method of programming an e-fuse device. The programmable e-fuse device comprises:

an e-fuse device having multiple fuse structures, each of the multiple fuse structures having a sense output end logically connected together with an OR operation to provide an e-fuse device output; and, a transistor device corresponding to each multiple fuse structure and operatively connected at another end of the corresponding fuse structure for controlling current flow therethrough according to a received fuse programming signal, each of the multiple fuse structures and the corresponding multiple programming devices being dimensioned to achieve a coding redundancy such that one fuse structure of the multiple fuse structures provides for a current flow within optimal programming current density to ensure programming reliability of the e-fuse device.

Particularly, in a first embodiment, the redundancy is achieved by providing each of the multiple fuses with different fuselink dimensions (e.g., widths, lengths or combinations thereof) with the size of each corresponding programming transistor being identical. In a second embodiment, the redundancy is achieved by providing programming transistors with different channel dimensions, e.g., lengths or widths, with the size of each corresponding fuselink dimensions being identical.

If the e-fuse device is to be left unprogrammed, none of the fuse structure is programmed. The output of the e-fuse device is the logical OR of the sense output of the unprogrammed fuse structures, which is "0" or "unprogrammed." If the e-fuse device is to be programmed, each of the fuse structures in the e-fuse device is programmed. Despite the wide variation of the programming current, one of the multiple fuse structures will have the optimal level of programming current density. The fuse structure provides "1" or "programmed" sense output to the OR logic of the e-fuse device. Consequently, the output of the e-fuse device is "1" or "programmed." Since at least one of the fuse structure programs within the optimal programming window range, the coding of the information in the e-fuse device is reliable.

According to a further aspect of the invention, there is provided a device for encoding multiple information bits in a semiconductor chip comprising:

a plurality of bit cell structures, each bit cell structure for receiving one programmed information bit, each bit cell structure comprising:

an e-fuse device having multiple fuse structures, each of the multiple fuse structures having a sense output end logically connected together with an OR operation to provide a bit cell output; and, a transistor device corresponding to each multiple fuse structure and operatively connected at another end of the corresponding fuse structure for controlling current flow therethrough according to a received programming signal, each the multiple fuse structures and the corresponding multiple programming devices being dimensioned to achieve a coding redundancy such that one fuse structure of the multiple fuse structures provides for a current flow within the optimal current density to ensure programming reliability of the e-fuse device, whereby programming reliability of the e-fuse device is enhanced.

The increased accuracy and reliability of the coded information enables the use of e-fuses in critical applications where a failure to code information is critical.

For any application that uses conventional e-fuses, this method of increasing accuracy and reliability of the coded information may be used to improve the chip reliability.

Advantageously, the ability to program the fuses independently of the state of the chip, therefore, allows ease of programming and can open new applications such as hot-programming, i.e., programming of the fuses while the rest of the chip is running. Moreover, the current invention can be used to encode any critical information that requires high reliability and accuracy.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENT

As will be described herein, when there are multiple e-fuse devices, each e-fuse device is called a bit cell, in the context that each e-fuse device encodes one bit of information. Thus, two terms, e-fuse device and bit cell, are interchangeably used when there are multiple e-fuse devices involved in the following description.

Additionally, two terms, fuse structure and fuse, are interchangeably used in the following description.

Figure 3:
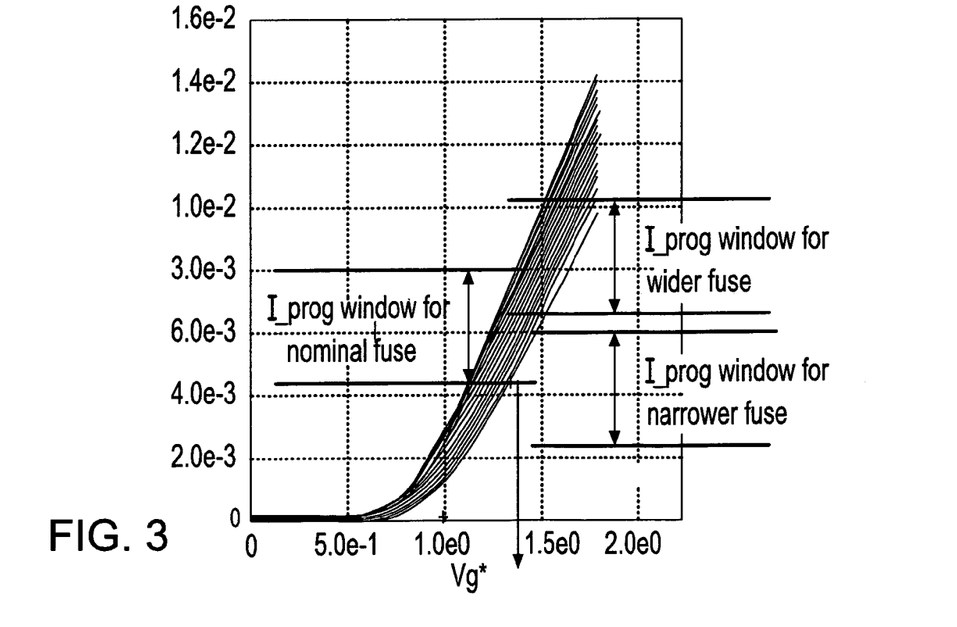
FIG. 3 is a graph depicting the variation in $I_{DS}$–$V_{GS}$ characteristics of an e-fuse device along with an indication of the redundancy built into the method of programming the e-fuse.

To insure that the fuse programming information is coded reliably, redundancy in the e-fuse coding is implemented in the semiconductor chip. According to a first embodiment, the redundancy is achieved by programming multiple e-fuses with different fuselink dimensions (e.g., widths, lengths or combinations thereof). Despite the wide variation of the programming current, as shown in FIG. 3, one of the multiple fuses will have the optimal level of programming current density (I_prog or I_on). Therefore, the coding of the information is reliable and accurate.

Figure 4:
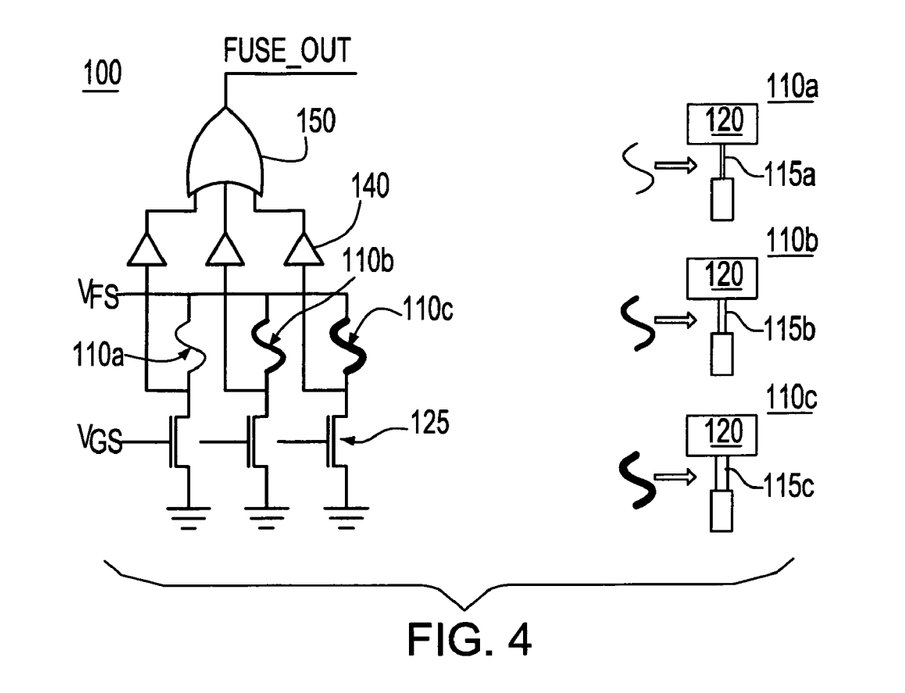
FIG. 4 depicts an e-fuse device 100 for encoding optimal programming gate voltages according to a first embodiment of the invention.

According to the first embodiment of the invention, an e-fuse device 100 for encoding optimal programming gate voltages is provided as shown in FIG. 4. As shown in FIG. 4, by way of an example e-fuse application, there are one or more bit cells numbered $bitcell_0, \ldots, bitcell_n$ to be programmed with a programmed bit voltage, with each bit cell implementing a redundant programming feature. Particularly, for each bit cell, there is provided multiple fuse structures, e.g., three fuse structures 110a, 110b and 110c, logically connected for each bitcell. Each fuse structure is as shown in FIG. 4, having an anode portion 120 and cathode portion 130 and a connecting fuselink portion of varying widths, i.e., a narrow width 115a, a medium width 115b, and a thick width 115c. Thus, there is purposeful variation in each of the fuselink dimensions for each bitcell such that at least one of these three fuselinks of varying widths will have the correct dimension to produce the correct level of current density. It is understood that the variation may include the fuselink length and/or fuselink width. Methods for manufacturing the fuselink are well-known in the art such as described in U.S. Pat. No. 6,433,404 B1 and U.S. Pat. No. 6,624,499 B2. While in the first embodiment depicted in FIG. 4 only the fuselink widths are varied, the invention contemplates varying fuselink lengths as well. For example, three fuselinks having the same length while the fuselink width varies in a predetermined way, e.g., as nominal, nominal plus up to 15% variation (e.g., +15%), and nominal minus up to 15% variation (e.g., −15%). In a more specific example, if the nominal fuselink width is 93 nm, then the narrow fuselink width is 79 nm and the wider fuselink is 107 nm. In another example, for a nominal fuselink width of 63 nm, narrow fuselink is 54 nm and the wider fuselink is 73 nm. If all three fuses are logically connected for OR operation in the sense circuitry, even if some of the fuses "rupture" due to excessive programming current or some other(s) may have an "underblow" due to insufficient current, at least one will program correctly as long as the fuse programming has a generic process window greater than about 15% in terms of programming current and the total deviation of the process does not exceed about 22.5% in terms of the programming current for the nominal fuse width.

As further shown in FIG. 4, each fuse structure 110a, 110b and 110c is provided with a respective programming transistor (e.g., a FET device) 125, such that an anode of the structure is connected to one transistor terminal (e.g., a drain) and the other transistor terminal (e.g., source) connected with ground, for example. In the first embodiment, the size of each programming transistor 125 is identical, so that a programmed gate voltage Vgs should enable identical amount of current flow through each fuse structure. Specifically, as a gate pulse Vgs is applied to each respective programming transistor, said programming transistor will enable current flow through a fuse structure. As further shown in FIG. 4, the cathode of each fuse structure 110a, 110b and 110c is provided with a respective buffer device 140, an output of each buffer device connected to a respective input of an OR circuit 150 implementing an OR gate 150. The output of each OR gate, i.e., $Fuse\_out_0, \ldots, Fuse\_out_n$ corresponding to each respective bit cell $bitcell_0, \ldots, bitcell_n$, represents the programmed bit of information. It is understood that any equivalent logical connection may be provided, e.g., a NOR followed by an inverter (NOT) device.

As shown in the first embodiment of the invention as depicted in the example e-fuse device shown in FIG. 4, each bit cell (1 bit) uses three physical fuse structures, each fuselink in the three fuse structures having different widths, logically connected in an OR configuration. Thus, in a semiconductor device, one bit of information is encoded with three different fuses such that, as an example, if 4 bits of information are to be coded for the optimal programming voltage setting, and if 3 fuses are to be used to encode one bit, then a total of 12 fuses will be programmed to contain the information along with an OR circuit that would sense any programmed fuse among the group of three fuses for the same bit as a bit output of one (1).

Figure 6:
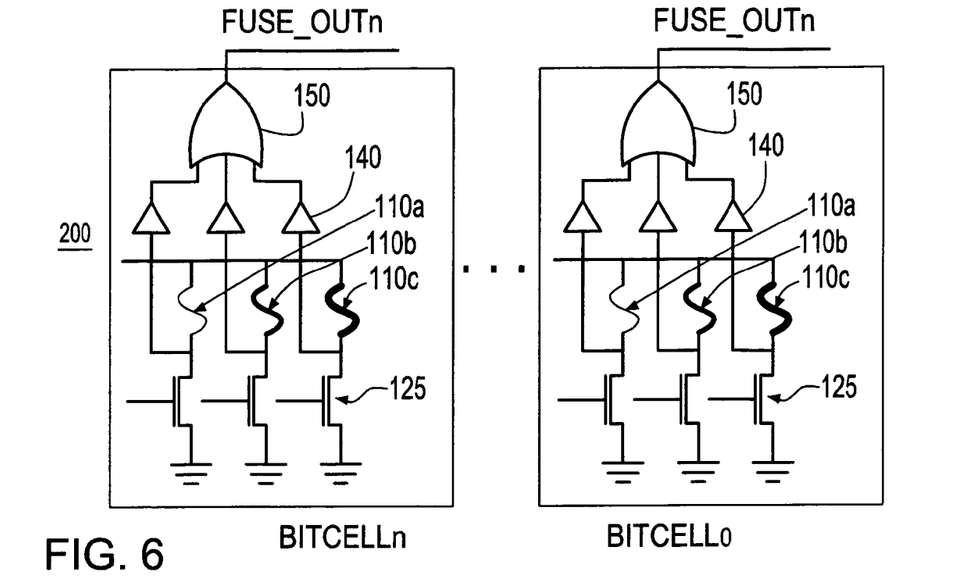
FIG. 6 depicts multiple bit cells 200 for encoding optimal programming gate voltages according to a first embodiment of the invention.

FIG. 6 depicts an implementation where multiple bit cells are employed to code multiple bits of information using the e-fuse devices described in FIG. 4. The multiple fuses corresponding to the same bit information are sensed with logical OR operation so that if only one of the multiple fuses sense as programmed, then the sense output is for that bit is programmed, or 1. Only when none of the multiple fuses for the same bit are programmed does the bit read as unprogrammed or 0. It is understood that at least two or more than three fuses may be used to ensure reliable coding redundancy. Sufficient variation must be provided in the dimensions of the fuselink such that all of the variation of the programming transistor is accounted for so that at least one of the fuses 110a-110c is of the correct programming current density range.

Figure 5:
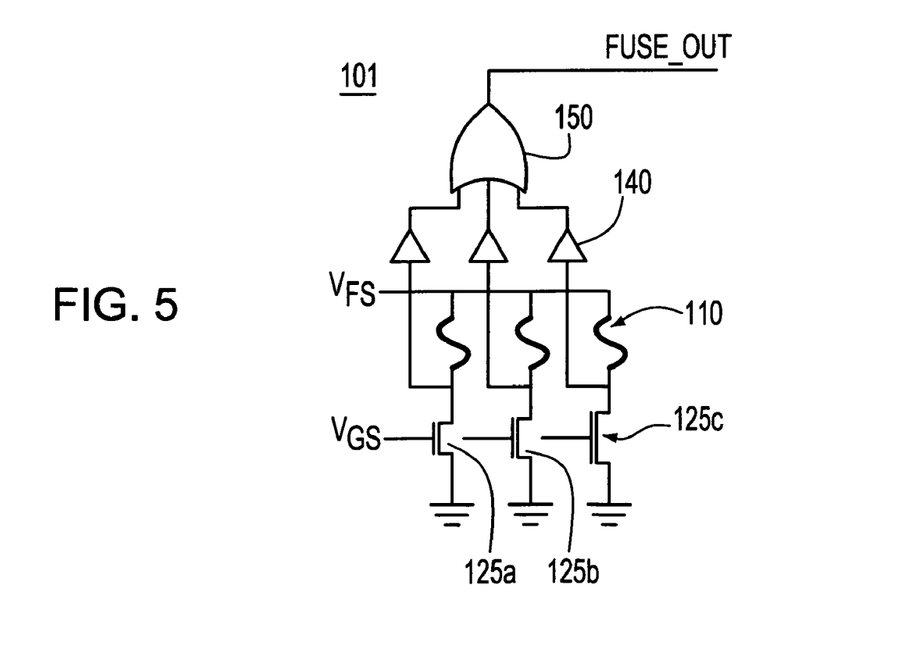
FIG. 5 depicts an e-fuse device 101 for encoding optimal programming gate voltages according to a second embodiment of the invention.

In a second embodiment as depicted in FIG. 5, a fuse device 101 for encoding optimal programming gate voltages, is provided. As shown in FIG. 5, by way of example, there are one or more bit cells numbered $bitcell_0, \ldots, bitcell_n$ to be programmed with a programmed bit voltage, with each bit cell implementing a redundant programming feature. Particularly, for each bit cell, there is provided multiple fuse structures, e.g., three fuse structures 110 being shown in the FIG. 5 for each bitcell. In the embodiment of FIG. 5, each fuse structure is as shown in FIG. 4, having an anode 120 and cathode portion 130 and a connecting fuselink portion 115. In this second embodiment, each fuselink portion 115 is of identical size, thus, potentially providing paths for accommodating identical current flow densities. Each fuse structure 110 in the programmable bitcell is provided with a respective programming transistor (e.g., a FET device). However, in the second embodiment depicted in FIG. 5, programming redundancy is achieved by providing programming transistors of various sizes, e.g., varied channel widths or lengths of the programming transistor, such that the delivery of current into the fuse will vary according to the degree of change of the transistor dimensions. Thus, as shown in FIG. 5, the fuse bitcell includes a programming transistor 125a of a smaller size (length and/or width dimension), a programming transistor 125b of medium size, and a programming transistor 125a of a smaller size. In an example embodiment, the programming transistor sizes are varied to provide either channel widths or lengths that are nominal, nominal plus up to 15% variation (e.g., +15%), and nominal minus up to 15% variation (e.g., −15%). As in the embodiment depicted in FIG. 4, one transistor terminal (e.g., a drain) of a programming transistor is connected to an anode of the fuse structure 115 and the other transistor terminal (e.g., source) is connected to the ground, for example. In the second embodiment, the size of each programming transistor 125 is varied, so that the same programmed gate voltage or gate pulse Vgs applied to the transistor 125a, 125b or 125c will enable differing amounts of current flow through each fuse structure 110. As long as sufficient variation is provided in the dimensional variations (size) of each programming transistor, at least one of the fuses 110 is of the correct programming current density range. As further shown in FIG. 5, the cathode of each fuse structure 110 is provided with a respective buffer device 140, an output of each buffer device connected to a respective input of an OR circuit 150 implementing an OR gate 150.

Figure 7:
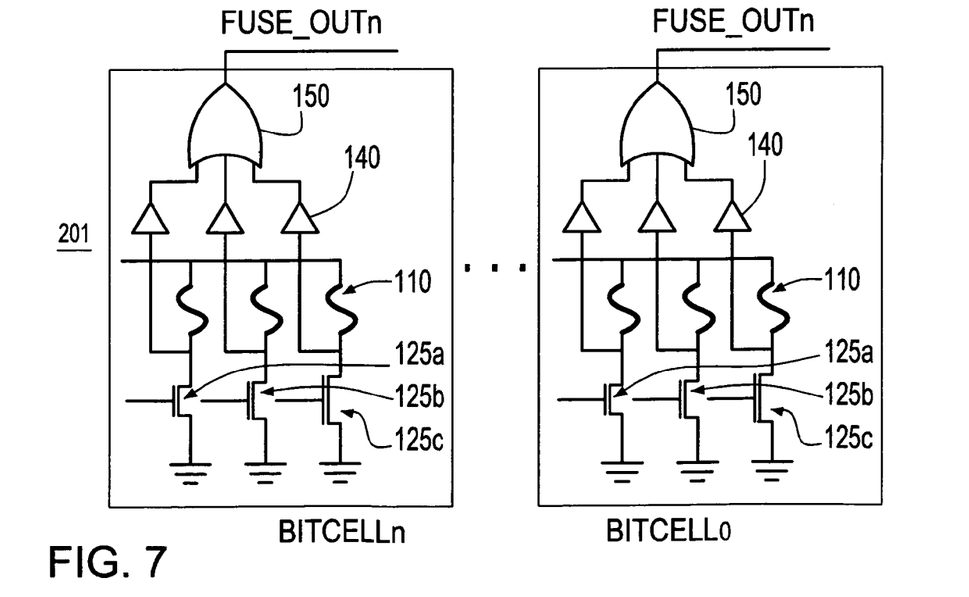
FIG. 7 depicts multiple bit cells 201 for encoding optimal programming gate voltages according to a second embodiment of the invention.

FIG. 7 depicts an implementation where multiple bit cells are employed to code multiple bits of information using the e-fuse devices described in FIG. 5. The output of each OR gate, i.e., Fuse_out$_0$, . . . , Fuse_out$_n$ corresponding to each respective bit cell bitcell$_0$, . . . , bitcell$_n$, represents the programmed bit of information.

Thus, as shown in the second embodiment of the invention as depicted in the example e-fuse device shown in FIG. 5, each bit cell (1 bit) uses three identical sized fuses, each fuse having an associated programming transistor of varying sizes (e.g., channel widths or lengths), logically connected in an OR configuration. Thus, in a semiconductor device, one bit of information is encoded with three different fuses. As long as sufficient variation is provided in the sizes of the programming transistors such that all of the variation of the programming transistor is accounted for so that at least one of the fuses 110 is of the correct programming current density range.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

What is claimed is:

1. A programmable e-fuse device for a semiconductor chip comprising:
    multiple fuse structures for encoding a bit of information, each having one end logically connected together to provide an e-fuse device output; and,
    multiple programming transistors, a programming transistor of said multiple programming transistors corresponding to a fuse structure and having a terminal operatively connected at another end of said corresponding fuse structure for controlling current flow therethrough according to a received fuse programming signal, each said multiple fuse structures and said corresponding multiple programming transistors being dimensioned to achieve a coding redundancy such that one fuse structure of said multiple fuse structures provides for a current flow of sufficient current density to ensure programming reliability of said e-fuse device,
    wherein each said corresponding programming transistor device is of substantially identical size and, each fuse structure of said multiple fuse structures is of a different size.

2. The device as claimed in claim 1, further including a logic circuit for logically connecting said one end of said fuse structures, said logic circuit comprises a logic gate having an output representing a programmed bit.

3. The device as claimed in claim 1, wherein each said fuse structures has a different one or more of: width dimension, length dimension or, combination of width and length dimensions, to provide said coding redundancy.

4. The device as claimed in claim 3, wherein one of said multiple fuse structures has one of a width dimension or length dimension that is different within a predetermined range from a respective nominal width dimension or length dimension.

5. The device as claimed in claim 1, wherein the fuse structures are of a material comprising one of: a metallic material or organic material.

6. The device as claimed in claim 5, wherein said metallic fuse material is selected from the group comprising titanium silicide, tantalum silicide, cobalt silicide, nickel silicide, and alloys of a silicide alloyed with another metal.

7. A programmable e-fuse device for a semiconductor chip comprising:
    multiple fuse structures for encoding a bit of information, each having one end logically connected together to provide an e-fuse device output; and,
    multiple programming transistors, a programming transistor of said multiple programming transistors corresponding to a fuse structure and having a terminal operatively connected at another end of said corresponding fuse structure for controlling current flow therethrough according to a received fuse programming signal, each said multiple fuse structures and said corresponding multiple programming transistors being dimensioned to achieve a coding redundancy such that one fuse structure of said multiple fuse structures provides for a current flow of sufficient current density to ensure programming reliability of said e-fuse device,
    wherein each fuse structure is of substantially identical size and each corresponding programming transistor device is of a different size.

8. The device as claimed in claim 7, wherein each said at least one programming transistor device has a different one or more of: channel width dimension, channel length dimension or, combination length or width channel dimensions to provide said coding redundancy.

9. The device as claimed in claim 8, wherein one of said corresponding multiple programming transistor devices has one of a channel width or length dimension is different within a predetermined range from a respective nominal transistor channel width dimension or length dimension.

10. A method of programming an e-fuse device in a semiconductor chip comprising:

logically connecting one end of multiple fuse structures for encoding a bit of information in parallel to provide an e-fuse device output, one of said multiple fuse structures having an optimal level of programmed current density; and, activating a programming transistor operatively connected to a corresponding fuse structure for controlling current flow therethrough according to a received fuse programming signal, each said multiple fuse structures and said corresponding multiple programming devices being dimensioned to achieve a coding redundancy such that one fuse structure of said multiple fuse structures provides for a current flow of sufficient current density to ensure programming reliability of said e-fuse device, wherein each said corresponding programming transistor device is of substantially identical size and, each fuse structure of said multiple fuse structures is of a different size.

11. The method as claimed in claim 10, wherein each said fuse structures has a different one or more of: width dimension, length dimension or, combination of width and length dimensions, to provide said coding redundancy.

12. The method as claimed in claim 11, wherein at least one of said multiple fuse structures has one of a width dimension or length dimension that is different within a predetermined range from a respective nominal width dimension or length dimension.

13. The method as claimed in claim 10, wherein said activating comprises applying a fuse programming voltage to said transistor, a fuse programming voltage value information being stored in said chip.

14. The method as claimed in claim 13, further comprising: sensing an output of said logic gate until a fuse state condition is detected, said programmed voltage value corresponding to a voltage at a gate terminal of said programmed transistor when a redundant fuse is programmed.

15. The method as claimed in claim 10, wherein said logically connecting includes providing a logic gate having inputs connected to said one end of said fuse structure.

16. A method of programming an e-fuse device in a semiconductor chip comprising:

logically connecting one end of multiple fuse structures for encoding a bit of information in parallel to provide an e-fuse device output, one of said multiple fuse structures having an optimal level of programmed current density; and, activating a programming transistor operatively connected to a corresponding fuse structure for controlling current flow therethrough according to a received fuse programming signal, each said multiple fuse structures and said corresponding multiple programming devices being dimensioned to achieve a coding redundancy such that one fuse structure of said multiple fuse structures provides for a current flow of sufficient current density to ensure programming reliability of said e-fuse device, wherein each fuse structure is of substantially identical size and each programming transistor device is of a different size.

17. The method as claimed in claim 16, wherein each said at least one programming transistor device has a different one or more of: channel width dimension, channel length dimension or, combination length or width dimensions to provide said coding redundancy.

18. The method as claimed in claim 17, wherein at least one of said corresponding multiple programming transistor devices has one of a channel width or channel length dimension is different within a predetermined range from a respective nominal transistor channel width dimension or length dimension width dimension or length dimension.

19. The method as claimed in claim 16, wherein said activating comprises applying a fuse programming voltage to said transistor, a fuse programming voltage value information being stored in said chip.

20. The method as claimed in claim 16, wherein said logically connecting includes providing a logic gate having inputs connected to said one end of said fuse structure.

21. A device for encoding multiple information bits in a semiconductor chip comprising:

a plurality of bit cell structures, each bit cell structure for receiving one programmed information bit, each bit cell structure comprising:

multiple fuse structures, each said multiple fuse structures having one end logically connected together to provide a bit cell output; and, multiple programming transistors, each of which corresponding to each of said multiple fuse structures and operatively connected at another end of said corresponding fuse structure for controlling current flow therethrough according to a received programming signal, each said multiple fuse structures and said corresponding multiple programming devices being dimensioned to achieve a coding redundancy such that one fuse structure of said multiple fuse structures provides for a current flow of sufficient current density to ensure programming reliability of said e-fuse device, said coding redundancy being achieved by one of: programming each fuse link of said multiple fuse structures with different fuselink dimensions while said multiple programming transistors are of constant size, or programming said multiple transistors with different sizes while dimensions of said fuse links are kept constant, whereby programming reliability of said e-fuse device is enhanced.

* * * * *